United States Patent
Degani et al.

(10) Patent No.: US 10,110,245 B2
(45) Date of Patent: Oct. 23, 2018

(54) APPARATUS FOR INTERPOLATING BETWEEN A FIRST SIGNAL EDGE AND A SECOND SIGNAL EDGE, A METHOD FOR CONTROLLING SUCH APPARATUS, AND AN INTERPOLATION CELL FOR A DIGITAL-TO-TIME CONVERTER

(71) Applicant: Intel IP Corporation, Santa Clara, CA (US)

(72) Inventors: Ofir Degani, Nes-Ammin (IL); Rotem Banin, Even-Yehuda (IL); Assaf Ben-Bassat, Haifa HA (IL); Sebastian Sievert, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/811,721

(22) Filed: Nov. 14, 2017

(65) Prior Publication Data

US 2018/0175878 A1   Jun. 21, 2018

(30) Foreign Application Priority Data

Dec. 21, 2016 (EP) .................................... 16205845

(51) Int. Cl.
| | |
|---|---|
| H03M 1/82 | (2006.01) |
| H03K 5/135 | (2006.01) |
| H03K 5/131 | (2014.01) |
| H04W 88/02 | (2009.01) |
| H03K 5/00 | (2006.01) |

(52) U.S. Cl.
CPC .............. *H03M 1/82* (2013.01); *H03K 5/131* (2013.01); *H03K 5/135* (2013.01); *H03K 2005/00052* (2013.01); *H03K 2005/00058* (2013.01); *H04W 88/02* (2013.01)

(58) Field of Classification Search
CPC ......... H03M 1/82; H03K 5/131; H03K 5/135; H03K 2005/00052; H03K 2005/00058; H04Q 88/02
USPC .................. 341/152, 155, 166; 375/295, 302
See application file for complete search history.

(56) References Cited

U.S. PATENT DOCUMENTS

| | | | |
|---|---|---|---|
| 8,228,110 B1 | 7/2012 | Song et al. | |
| 8,908,804 B2* | 12/2014 | Kuttner | H03C 3/12 |
| | | | 375/295 |
| 9,137,084 B2 | 9/2015 | Degani et al. | |
| 9,397,689 B2* | 7/2016 | Tertinek | H03K 5/06 |
| 9,407,245 B2 | 8/2016 | Sievert et al. | |

(Continued)

OTHER PUBLICATIONS

Souliotis George et al.: "Phase Interplator with Improved Linearity"; May 29, 2015.

*Primary Examiner* — Khai M Nguyen
(74) *Attorney, Agent, or Firm* — 2SPL Patentanwaelte Part G mbB; Mani Arabi

(57) ABSTRACT

An apparatus for interpolating between a first signal edge and a second signal edge is provided. The apparatus includes a plurality of interpolation cells coupled to a common node. At least one of the plurality of interpolation cells is configured to supply, based on a control word, the first signal edge and/or the second signal edge to the common node. Further, the apparatus includes a control circuit configured to activate all of the plurality interpolation cells in a first mode of operation, and to deactivate part of the plurality of interpolation cells in a second mode of operation.

23 Claims, 5 Drawing Sheets

(56) References Cited

U.S. PATENT DOCUMENTS

2015/0249454 A1  9/2015  Giaconi et al.
2017/0093556 A1  3/2017  Degani et al.

* cited by examiner

APPARATUS FOR INTERPOLATING BETWEEN A FIRST SIGNAL EDGE AND A SECOND SIGNAL EDGE, A METHOD FOR CONTROLLING SUCH APPARATUS, AND AN INTERPOLATION CELL FOR A DIGITAL-TO-TIME CONVERTER

FIELD

Examples relate to phase interpolation. In particular, examples relate to an apparatus for interpolating between a first signal edge and a second signal edge, a method for controlling an apparatus for interpolating between a first signal edge and a second signal edge, and an interpolation cell for a digital-to-time converter.

BACKGROUND

Digital-to-Time Converters (DTC) apply a phase shift/time delay on the edges of an incoming clock signal. DTCs are, e.g., used in modern highly efficient all digital polar transmitter architectures, or in clocking systems. In digital polar transmitter architectures, DTCs enable inter alia very wideband modulation compared to two point modulation architectures. In clocking systems, DTCs enable clock frequency transitions within a single clock cycle, which provide further power consumption optimization for processing units.

Two important indicators for DTC performance are the resolution of the delay shift, which is determined by the number of digital control bits, and the phase noise added to the generated output signal (e.g. including thermal noise and jitter). Depending on the application, it may be desired to achieve low phase noise while providing high resolution. This may result in higher power consumption. In some applications, high delay resolution may be required not all the time and, e.g., depend on the system's operating conditions. In such systems, using a full performance DTC may be a show stopper for using the technology since it may result in a non-competitive power consumption in some of the system scenarios.

Hence, there may be a desire for an improved phase interpolation concept.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
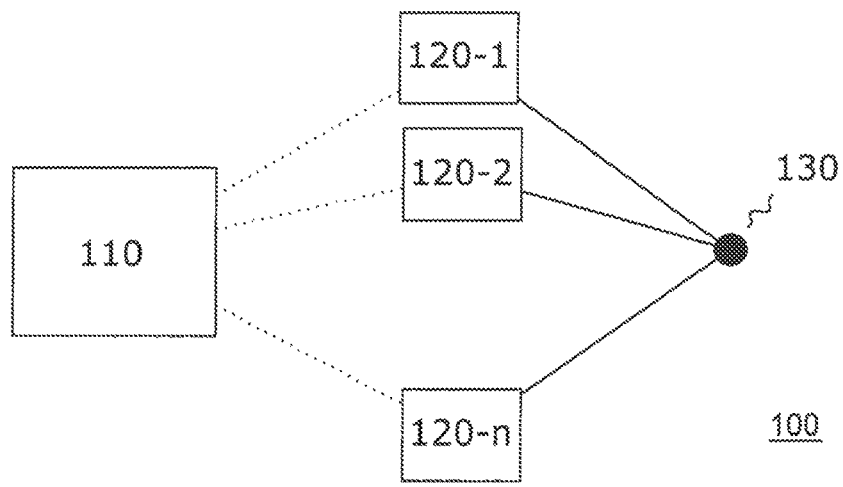
FIG. 1 illustrates an example of an apparatus for interpolating between a first signal edge and a second signal edge.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (EU-TRAN), LTE or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates an apparatus 100 for interpolating between a first signal edge and a second signal edge. The apparatus 100 includes a plurality of interpolation cells 120-1, 120-2, . . . , 120-n coupled to a common node 130. At least one of the plurality of interpolation cells 120-1, 120-2, . . . , 120-n is configured to supply, based on a control word, the first signal edge and/or the second signal edge to the common node 130. Further, the apparatus includes a control circuit 110 configured to activate all of the plurality interpolation cells 120-1, 120-2, . . . , 120-n in a first mode of operation, and configured to deactivate part of the plurality of interpolation cells 120-1, 120-2, . . . , 120-n in a second mode of operation.

The apparatus 100 may allow a trade-off between an interpolation resolution and a power consumption of the apparatus. While in the first mode of operation a highest interpolation resolution may be achieved, the interpolation resolution may be reduced in the second mode of operation. However, also the power consumption of the apparatus 100 may be reduced in the second mode of operation.

The plurality of interpolation cells 120-1, 120-2, . . . , 120-n may receive the first and the second signal edge. Based on the control word, the at least one of the plurality of interpolation cells 120-1, 120-2, . . . , 120-n is controlled to supply the first signal edge and/or the second signal edge to the common node 130. That is, the at least one of the plurality of interpolation cells 120-1, 120-2, . . . , 120-n may allow an interpolation with a resolution which is equal to half the timely distance between the first and the second signal edge.

The resolution of the interpolation between the first signal edge and the second signal edge at the common node 130 may be determined by the number of interpolation cells supplying the first signal edge and/or the second signal edge to the common node 130. It is evident that the resolution increases for an increasing number of interpolation cells supplying the first signal edge and/or the second signal edge to the common node 130. That is, based on the number of deactivated interpolation cells, the interpolation resolution at the common node 130 may be reduced for the benefit of reduced power consumption of the apparatus 100. In this respect, the part of the plurality of interpolation cells 120-1, 120-2, . . . , 120-n which is deactivated in the second mode of operation may comprise any number of interpolation cells between 1 and n−1 if the plurality of interpolation cells comprises n interpolation cells.

Hence, the control circuit 110 may in some examples be configured to deactivate the part of the plurality of interpolation cells 120-1, 120-2, . . . , 120-n in the second mode of operation based on a desired resolution of the interpolation between the first signal edge and the second signal edge. Accordingly, a minimum power consumption of the apparatus 100 for the desired resolution of the interpolation may be achieved.

In some examples, an output inverter (not illustrated) may be coupled between the common node 130 and an output node (not illustrated) of the apparatus. The output inverter may be configured to supply an output signal edge to the output node based on the first and/or second signal edges supplied to the common node 130 by activated interpolation cells of the plurality of interpolation cells 120-1, 120-2, . . . , 120-n.

The apparatus 100 may in some examples comprise a frequency divider circuit (not illustrated) configured to generate a second oscillation signal and a third oscillation signal based on a first oscillation signal. The second oscillation signal is synchronized with a first edge of the first oscillation signal, wherein the third oscillation signal is synchronized with a second edge of the first oscillation signal. For example, the first edge of the first oscillation signal may be a rising edge of the first oscillation signal, whereas the second edge of the first oscillation signal may be a falling edge of the first oscillation signal. The rising and the falling edge of the first oscillation signal may belong to the same oscillation period of the first oscillation signal. The frequency divider circuit may, e.g., comprise a Multi-Modulus Divider (MMD) for generating the second oscillation signal and the third oscillation signal. That is, frequencies of the second oscillation signal and the third oscillation signal may be lower than a frequency of the first oscillation signal.

Further, the apparatus 100 may comprise a sample circuit (not illustrated) configured to generate the first signal edge by sampling the second oscillation signal based on the first edge of the first oscillation signal, and to generate the second signal edge by sampling the third oscillation signal based on the second edge of the first oscillation signal. The sample circuit may, e.g., comprise a flip-flop circuit for generating the first and second signal edges. In some examples, the first and second signal edges may correspond to rising and falling signal edges of the first oscillation signal. For example, the first signal edge and the second signal edge may be timely separated by one half of an oscillation period of the first oscillation signal.

In some examples, the control circuit 110 may be configured to deactivate the sample circuit in the second mode of operation. If one or more interpolation cells which are supplied with the first and second signal edges by the sample circuit are deactivated in the second mode of operation, generation of the first and second signal edges is not required. Accordingly, deactivating the sample circuit may allow to save further power. Furthermore, leakage into the deactivated interpolation cells may be avoided.

Further, the plurality of interpolation cells 120-1, 120-2, ..., 120-n may be configured to supply either the first signal edge or the second signal edge to the common node 130, respectively. This may allow facilitated operation of a control path supplying the control word to the apparatus 100. In other words, further saving may be achieved in the digital path by further fixing the first interpolator to either the first input or the second input, which may result in eliminating one more bit on the expense of larger Integral Non-Linearity (INL).

The plurality of interpolation cells 120-1, 120-2, ..., 120-n may, e.g., be grouped in a plurality of interpolation cell rows. The part of the plurality of interpolation cells, which is deactivated in the second mode of operation, may correspond to at least one of the plurality of cell rows. The grouping of the plurality of interpolation cells 120-1, 120-2, ..., 120-n in interpolation cell rows may allow facilitated control of the resolution of the interpolation between the first and the second signal edge. For example, deactivating the interpolation cells of one interpolation cell row may allow to decrease the resolution by one bit.

The sample circuit of the apparatus 100 may, e.g., generate the first signal edge and the second signal edge for one of the plurality of interpolation cell rows. A second sample circuit of the apparatus 100 may generate the first signal edge and the second signal edge for another one of the plurality of interpolation cell rows. An output node of the sample circuit may be coupled to a second output node of the second sample circuit. This may allow to improve array the driving capabilities and the synchronization between the sample circuits.

For example, the apparatus 100 may comprises a separate sample circuit for each interpolation cell row. Alternatively, the apparatus 100 may comprise a plurality of sample circuits, wherein one of the plurality of sample circuit may generate the first signal edge and the second signal edge for one or more of the plurality of interpolation cell rows. If the interpolation cells of one of plurality of interpolation cell rows are deactivated in the second mode of operation, the associated sample circuit may also be deactivated. This may allow to reduce the power consumption of the apparatus 100 and to prevent leakage into the deactivated interpolation cells.

Generally speaking, some examples relate to means for interpolating between a first signal edge and a second signal edge. The means for interpolating comprises a plurality of cellular means coupled to a common node. At least one of the plurality of cellular means is configured to supply, based on a control word, the first signal edge and/or the second signal edge to a common node of the means for interpolating. Further the means for interpolating comprises a means for activating all of the plurality cellular means in a first mode of operation, and for deactivating part of the plurality of cellular means in a second mode of operation.

The plurality of cellular means may, e.g., be grouped in a plurality of rows, wherein the part of the plurality of cellular means corresponds to at least one of the plurality of rows.

The means for interpolating between a first signal edge and a second signal edge may be implemented by an apparatus for interpolating between a first signal edge and a second signal edge described above or below (e.g. FIG. 1). The plurality of cellular means may be implemented by a plurality of interpolation cells described above or below (e.g. FIG. 1). The means for activating all of the plurality interpolation cells in a first mode of operation, and for deactivating part of the plurality of interpolation cells in a second mode of operation may be implemented by a control circuit described above or below (e.g. FIG. 1).

Figure 2:
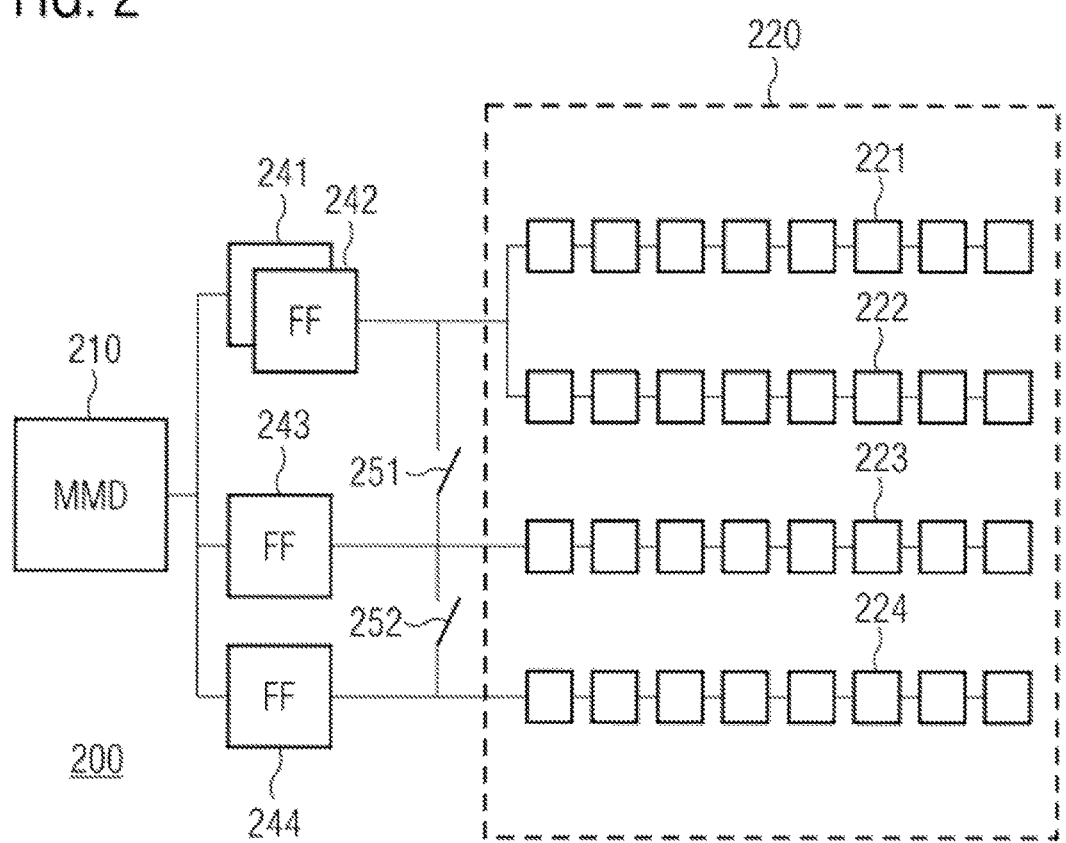
FIG. 2 illustrates an example of a DTC.

A DTC 200 using an apparatus for interpolating between a first signal edge and a second signal according to one or more aspects of the proposed concept is illustrated in FIG. 2.

The DTC 200 comprises a plurality of interpolation cells 220 grouped in a plurality of interpolation cell rows 221, 222, 223, 224. In the example illustrated in FIG. 2, 32 interpolation cells are organized in four interpolation cell rows and eight interpolation cell columns. It is to be noted, that in general any number of interpolation cells, any number of interpolation cell rows, and any number of interpolation cell columns may be used.

Based on a first oscillation signal, the MMD 210 may provide second and third oscillation signals to the flip-flop circuits 241, 242, 243, and 244 which supply the various interpolation cell rows 221, 222, 223, 224 with the first and second signal edges. Each interpolation cell row is driven by a respective flip-flop circuit.

In order to control a resolution of the interpolation between the first and the second signal edge, single rows of the plurality of interpolation cell rows 221, 222, 223, 224 may be activated or deactivated. For example, if all interpolation cell rows are activated, a 5 bit resolution may be achieved (since $2^5$ interpolation cells are activated). If the interpolation cell rows 221 and 222 are deactivated, a 4 bit resolution may be achieved (since $2^4$ interpolation cells are activated).). If the interpolation cell rows 221, 222 and 223 are deactivated, a 3 bit resolution may be achieved (since $2^3$ interpolation cells are activated). If further half of the cells of interpolation cell row 224 are deactivated, a 2 bit resolution may be achieved (since $2^2$ interpolation cells are activated).

In other words, the plurality of interpolation cells 220 may be grouped in a plurality of interpolation cell rows 221, 222, 223, 224, wherein the part of the plurality of interpolation cells, which is deactivated in the second mode of operation, corresponds to at least one of the plurality of cell rows 221, 222, 223, 224.

The one or more of the flip-flop circuits 241, 242, 243, 244 may additionally be deactivated, if their associated interpolation cell row is deactivated. This may allow further power reduction of the DTC 200. The deactivation of the flip-flop circuits may further prevent leakage into the deactivated interpolation cells.

Optionally, switches 251, 252 may be provided between outputs of the flip-flop circuits 241, 242, 243, 244 in order to improve array driving capabilities and synchronization when more interpolation cells are activated.

In other words, FIG. 2 may exhibit a top level topology view of a configurable DTC. As illustrated, a 32 cell array may be organized in 4 rows and 8 columns. The array rows may be controlled by the Most Significant Bit (MSB) of a control word. The array may be split into groups as shown (16/8/8 cells). The MMD re-sampling flip-flop circuits (with drivers) may be organized to drive each cell group. Each group may, e.g., be controlled by a respective ON/OFF signal that allows to turn it on or off and, thus, reduce 1 bit at a time from the cell array. The flip-flop circuits may also be turned on/off with the same signals, respectively, to allow further power reduction as the array cells are turned off. The flip-flop circuit turn-off may also eliminate any possible leakage in the turned-off cells. Additional parallel switches may be connected between the flip-flop circuit outputs to improve array driving capabilities and synchronization as more cells are turned on. That is, FIG. 2 may illustrate a new reconfigurable DTC topology, which enables delay resolution vs. power consumption trade-off. The proposed solution may enable power consumption vs. delay resolution trade-off with the same design, while previous solutions allowed only for a maximum power depending on the highest delay resolution needed.

Figure 3:
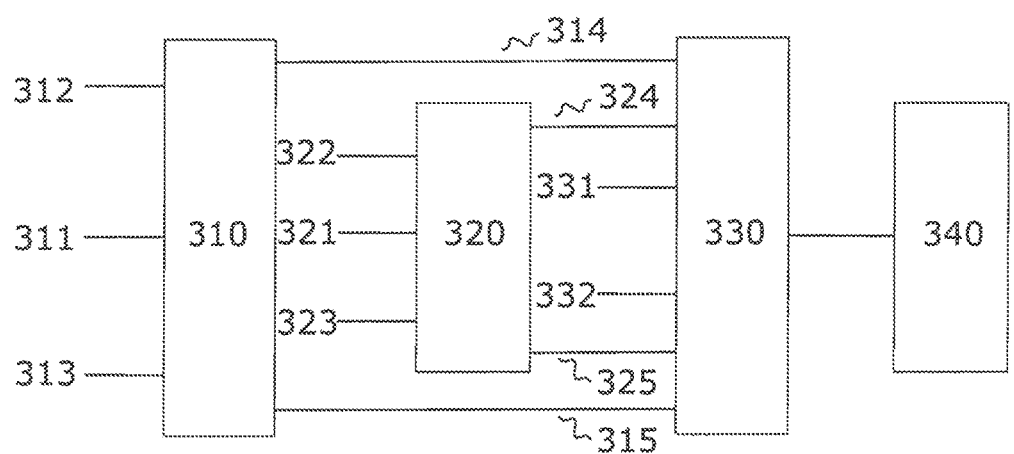
FIG. 3 illustrates an example of an interpolation cell for a DTC.

An interpolation cell 300 for a DTC, an apparatus for interpolation between a first signal edge and a second signal edge, or a phase interpolator is illustrated in FIG. 3. The interpolation cell is configured to receive a first signal edge 311 and a second signal edge 321. The interpolation cell 300 comprises a first inverter circuit 310 configured to generate inverted first signal edges 314, 315 based on the first signal edge 311, a first selection signal 312 and a second selection signal 313. Further, interpolation cell 300 comprises a second inverter circuit 320 configured to generate inverted second signal edges 324, 325 based on the second signal edge 321, a third selection 322 signal and a fourth selection signal 323. The interpolation cell 300 also comprises an activation circuit 330 coupled to the first inverter circuit 310 and the second inverter circuit 320. The activation circuit 330 is configured to decouple the first inverter circuit 310 and the second inverter circuit 320 from an output inverter 340 of the interpolation cell 300 based on a first activation signal 331 and a second activation signal 332.

The interpolation cell 300 may allow to interpolate between the first signal edge 311 and the second signal edge 321 if the interpolation cell 300 is activated (e.g. the first inverter circuit 310 and the second inverter circuit 320 may be coupled to the output inverter 340). Additionally, the interpolation cell 300 may be deactivated by the activation circuit 330 by decoupling the first inverter circuit 310 and the second inverter circuit 320 from the output inverter 340 of the interpolation cell 300 based on the first activation signal 331 and the second activation signal 332.

If the interpolation cell 300 is used in a phase interpolator, a DTC, or an apparatus for interpolation between the first signal edge and the second signal edge, and if the interpolation cell 300 is deactivated, its power consumption may be eliminated and further a high impedance (high-Z) output may be presented to a common node of the phase interpolator, the DTC, or the apparatus for interpolation between the first signal edge and the second signal edge (to which all interpolation cells are coupled). Accordingly, the interpolation at the common node may be not influenced by the interpolation cell 300. That is, deactivating one or more of the interpolations cell 300, may allow a trade-off between an interpolation resolution and a power consumption of the phase interpolator, the DTC or the apparatus for interpolation between the first signal edge and the second signal edge.

The first activation signal 331 and the second activation signal 332 may indicate a desired activation or deactivation of the interpolation cell 300. For example, the first activation signal 331 and the second activation signal 332 may be inverted.

The first inverter circuit 310 inverts the input first signal edge 311 on the basis of the first selection signal 312 and the second selection signal 313 in order to generate the inverted first signal edges 314, 315, and to supply them to the activation circuit 330. Similarly, the second inverter circuit 320 inverts the input second signal edge 321 on the basis of the third selection signal 322 and the fourth selection signal 323 in order to generate the inverted second signal edges 324, 325, and to supply them to the activation circuit 330.

The first selection signal 312, the second selection signal 313, the third selection signal 322 and/or the fourth selection signal 323 may, e.g., be based on a control word for the DTC, the apparatus for interpolation between the first signal edge and the second signal edge, or the phase interpolator. For example, the first selection signal 312 and the second selection signal 313 may be inverted. Similarly, the third selection signal 322 and the fourth selection signal 323 may be inverted.

Generally speaking, some examples relate to a cellular interpolation means for a DTC or a phase interpolator. The cellular interpolation means is configured to receive a first signal edge and a second signal edge. The cellular interpolation means comprises a means for generating inverted first signal edges based on the first signal edge, a first selection signal and a second selection signal. Further, the cellular interpolation means comprises a means for generating inverted second signal edges based on the second signal edge, a third selection signal and a fourth selection signal. The cellular interpolation means comprises also a means for decoupling the means for generating inverted first signal edges and/or the means for generating inverted second signal edges from an output inversion means of the cellular interpolation means based on a first activation signal and a second activation signal. The means for coupling is coupled to the means for generating inverted first signal edges and the means for generating inverted second signal edges.

The first selection signal, the second selection signal, the third selection signal and/or the fourth selection signal may be based on a control word for the DTC, or the phase interpolator.

The cellular interpolation means may be implemented by an interpolation cell described above or below (e.g. FIG. 3). The means for generating inverted first signal edges may be implemented by a first inverter circuit described above or below (e.g. FIG. 3). The means for generating inverted second signal edges may be implemented by a second inverter circuit described above or below (e.g. FIG. 3). The means for decoupling the means for generating inverted first signal edges and/or the means for generating inverted second signal edges to an output inversion means may be implemented by an activation circuit described above or below (e.g. FIG. 3).

Figure 4:
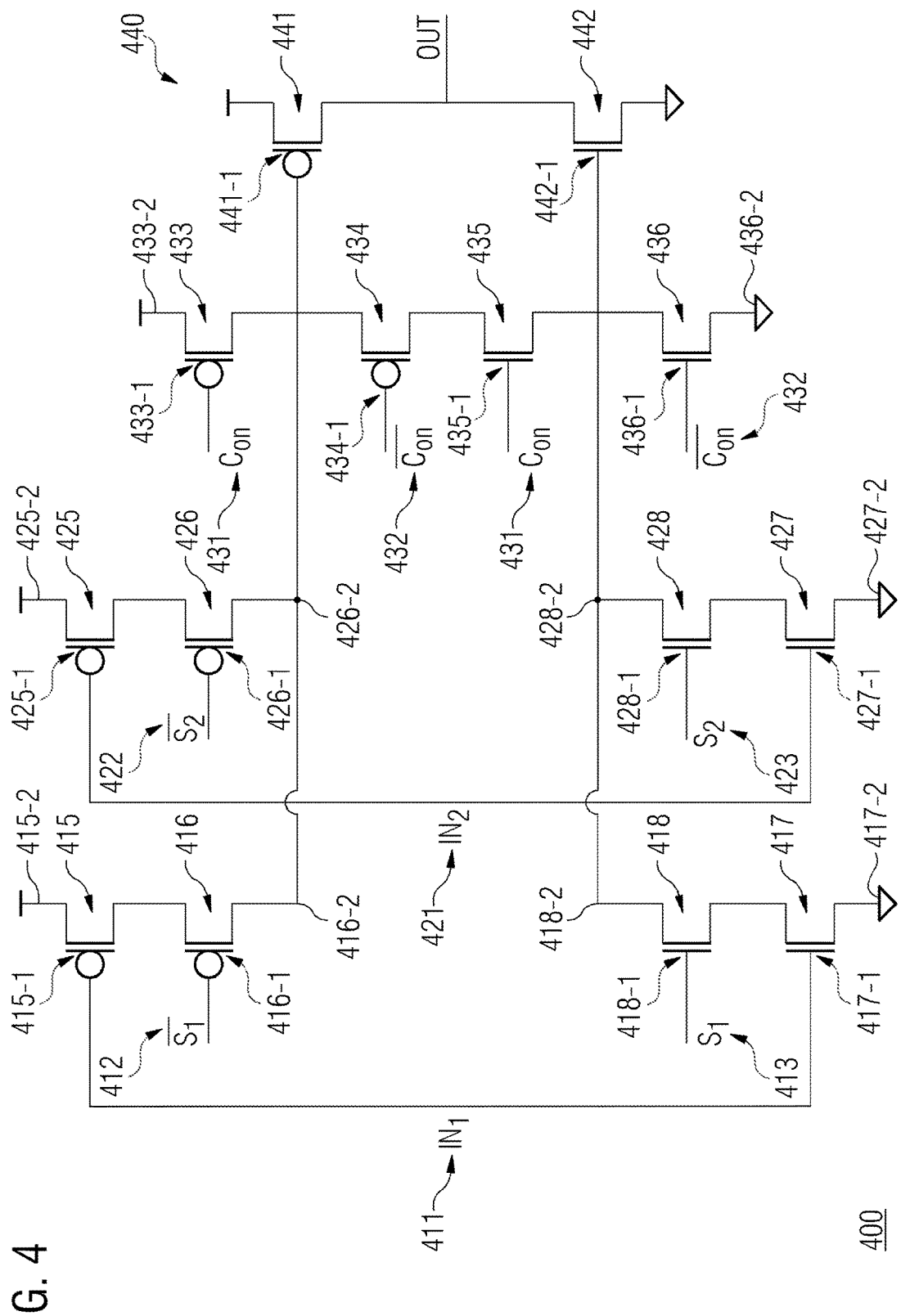
FIG. 4 illustrates another example of an interpolation cell for a DTC.
Figure 5:
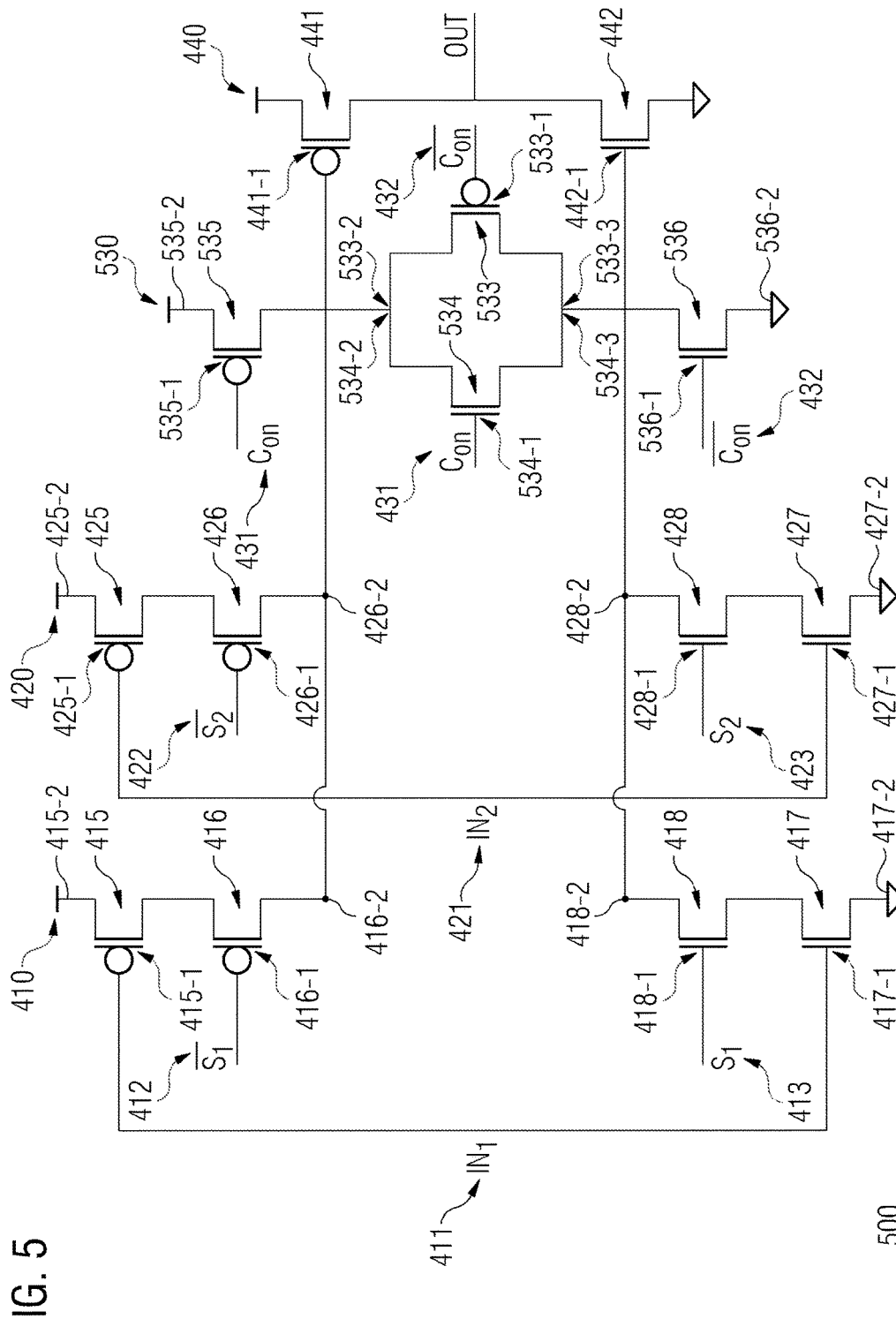
FIG. 5 illustrates still another example of an interpolation cell for a DTC.

More detailed implementations of interpolation cells which are based on the interpolation cell 300 are illustrated in FIGS. 4 and 5. FIG. 4 illustrates an interpolation cell 400. The interpolation cell 400 comprises a first inverter circuit 410 and a second inverter circuit 420.

The first inverter circuit 410 comprises a first transistor 415 and a second transistor 416 of a first conductivity type (e.g. p-type) which are coupled in series. The first transistor 415 is configured to receive the first signal edge 411 at a first control terminal 415-1 (e.g. gate terminal). The second transistor 416 is configured to receive the first selection signal 412 at a second control terminal 416-1 (e.g. gate terminal). A terminal 415-2 of the first transistor 415 is coupled to a defined potential.

The first inverter circuit 410 further comprises a third transistor 417 and a fourth transistor 418 of a different second conductivity type (e.g. n-type) which are coupled in series. The third transistor 417 is configured to receive the first signal edge 411 at a third control terminal 417-1 (e.g. gate terminal). The fourth transistor 418 is configured to receive the second selection signal 413 at a fourth control terminal 418-1 (e.g. gate terminal). A terminal 417-2 of the third transistor 417 is coupled to a defined potential (e.g. ground).

The first selection signal 412 and the second selection signal 413 are inverted.

The first transistor 415 and the second transistor 416 provide the first signal edge at a terminal 416-2 of the second transistor 416 based on the input first signal edge 411 and the first selection signal 412.

The third transistor 417 and the fourth transistor 418 provide the first signal edge at a terminal 418-2 of the fourth transistor 418 based on the input first signal edge 411 and the second selection signal 413.

The second inverter circuit 420 comprises a fifth transistor 425 and a sixth transistor 426 of the first conductivity type which are coupled in series. The fifth transistor 425 is configured to receive the second signal edge 421 at a fifth control terminal 425-1 (e.g. gate terminal).

The sixth transistor 426 is configured to receive the third selection signal 422 at a sixth control terminal 426-1 (e.g. gate terminal). A terminal 425-2 of the fifth transistor 425 is coupled to a defined potential.

The second inverter circuit 420 further comprises a seventh transistor 427 and an eighth transistor 428 of the second conductivity type which are coupled in series. The seventh transistor 427 is configured to receive the second signal edge 421 at a seventh control terminal 427-1 (e.g. gate terminal). The eighth transistor 428 is configured to receive the fourth selection signal 423 at an eighth control terminal 428-1 (e.g. gate terminal). A terminal 427-2 of the seventh transistor 427 is coupled to a defined potential (e.g. ground).

The third selection signal 422 and the fourth selection signal 423 are inverted.

The fifth transistor 425 and the sixth transistor 426 provide the second signal edge at a terminal 426-2 of the sixth transistor 426 based on the input second signal edge 421 and the third selection signal 422.

The seventh transistor 427 and the eighth transistor 428 provide the second signal edge at a terminal 428-2 of the eighth transistor 428 based on the input second signal edge 421 and the fourth selection signal 423.

The interpolation cell 400 further comprises an activation circuit 430 coupled to the first inverter circuit 410 (e.g. to terminal 416-2 of the second transistor 416, and to terminal 418-2 of the fourth transistor 418) and the second inverter circuit 420 (e.g. to terminal 426-2 of the sixth transistor 426, and to terminal 428-2 of the eighth transistor 428). The activation circuit 430 is configured to decouple the first inverter circuit 410 and the second inverter circuit 420 from an output inverter 440 of the interpolation cell 400 based on a first activation signal 431 and a second activation signal 432. On the contrary, the activation circuit 430 may allow to couple the first inverter circuit 410 and the second inverter circuit 420 to the output inverter 440.

If the activation circuit 430 is set to an active mode, first signal edges from the first inverter circuit 410 and/or second signal edges from the second inverter circuit 420 may be supplied to the output inverter 440 (depending on the first to fourth selection signals 412, 413, 422, 423). If the activation circuit 430 is set to an inactive mode, no signal edges may be supplied to the output inverter 440.

The activation circuit 430 comprises a ninth transistor 433 and a tenth transistor 434 of the first conductivity type which are coupled in series. The ninth transistor 433 and a tenth transistor 434 are coupled to the second transistor 416 (e.g. to terminal 416-2 of the second transistor 416) and the sixth transistor 426 (e.g. to terminal 426-2 of the sixth transistor 426). Further, the ninth transistor 433 is configured to receive the first activation signal 431 at a ninth control terminal 433-1 (e.g. gate terminal). The tenth transistor 434 is configured to receive the second activation signal 432 at a tenth control terminal 434-1 (e.g. gate terminal).

The activation circuit 430 further comprises an eleventh transistor 435 and a twelfth transistor 436 of the second conductivity type. The eleventh transistor 435 and the twelfth transistor 436 are coupled in series to the ninth transistor 433 and the tenth transistor 434. Further, the eleventh transistor 435 and the twelfth transistor 436 are coupled to the fourth transistor 418 (e.g. to terminal 418-2 of the fourth transistor 418) and the eighth transistor 428 (e.g. to terminal 428-2 of the eighth transistor 428). The eleventh transistor 435 is configured to receive the first activation signal 431 at an eleventh control terminal 435-1 (e.g. gate terminal). The twelfth transistor 436 is configured to receive the second activation signal 432 at a twelfth control terminal 436-1 (e.g. gate terminal).

The transistors of the activation circuit 430 are coupled between two defined potentials.

The first activation signal 431 and the second activation signal 432 are inverted. The first activation signal 431 and the second activation signal 432 indicate a desired activation or deactivation of the interpolation cell.

The output inverter 440 comprises a thirteenth transistor 441 of the first conductivity type which is coupled in series with a fourteenth transistor 442 of the second conductivity type.

The thirteenth transistor 441 and the fourteenth transistor 442 are coupled between two defined potentials. A thirteenth control terminal 441-1 (e.g. gate terminal) of the thirteenth transistor 441 is coupled to the second transistor 416 (e.g. to terminal 416-2 of the second transistor 416) and the sixth transistor 426 (e.g. to terminal 426-2 of the sixth transistor 426) via the activation circuit 430. A fourteenth control terminal 442-1 (e.g. gate terminal) of the fourteenth transistor 442 is coupled to the fourth transistor 418 (e.g. to terminal 418-2 of the fourth transistor 418) and the eighth transistor 428 (e.g. to terminal 428-2 of the eighth transistor 428) via the activation circuit 430.

The output invert 440 may provide an output signal edge of the interpolation cell 400 based on the first and/or second signal edges supplied to the output invert 440 if the interpolation cell 400 is activated (e.g. first activation signal 431 is high, and second activation signal 432 is low). For example, the output signal edge of the interpolation cell 400 may be the first signal edge, the second signal, or a combination thereof.

If the interpolation cell 400 is deactivated (e.g. first activation signal 431 is low, and second activation signal 432 is high), the ninth transistor 433 is in a conductive state (i.e. on) and the tenth transistor 434 is in a non-conductive state (i.e. off). Accordingly, the thirteenth control terminal 441-1 of the thirteenth transistor 441 is set to the defined potential (e.g. $V_{cc}$) which is supplied to input terminal 433-2 of the ninth transistor 433. The thirteenth transistor 441 is therefore in a non-conductive state. At the same time, the twelfth transistor 436 is in a conductive state and the eleventh transistor 435 is in a non-conductive state. Accordingly, the fourteenth control terminal 442-1 of the fourteenth transistor 442 is set to the defined potential (e.g. $V_{ss}$) which is supplied to input terminal 436-2 of the twelfth transistor 436. The fourteenth transistor 442 is therefore in a non-conductive state. Since the thirteenth transistor 441 and the fourteenth transistor 442 are in a non-conductive state, the output inverter 440 and, hence, also the interpolation cell 400 presents high impedance at its output.

FIG. 4 may illustrate a unit cell design for a phase interpolation cell array that allows to turn off the cell and to eliminate its power consumption, while presenting a high impedance output load to remove its influence on a second interpolation node (common node) to which all cells of the phase interpolation cell array are coupled. Beyond disconnecting the cell from supply, presenting high impedance to the second interpolation node (common node) may allow to eliminate the impact of the cell on the interpolation at the second interpolation node (common node). FIG. 4 may, hence, represent an array unit cell design with control logic which may allow to turn off the cell and to provide a high impedance output.

FIG. 5 illustrates another interpolation cell 500. Interpolation cell 500 is similar to interpolation cell 400 illustrated in FIG. 4. However, activation circuit 530 of interpolation cell 500 is different from activation circuit 430 of interpolation cell 400. In the following, only the different in the activation circuits between interpolation cell 400 and interpolation cell 500 is described.

The activation circuit 530 comprises a ninth transistor 533 of the first conductivity type and a tenth transistor 534 of the second conductivity type which are coupled in parallel. Input terminals 533-2, 534-2 of the ninth transistor 533 and the tenth transistor 534 are coupled to an eleventh transistor 535 of the first conductivity type. Output terminals 533-3, 534-3 of the ninth transistor 533 and the tenth transistor 534 are coupled to a twelfth transistor 536 of the second conductivity type.

The ninth transistor 533 is configured to receive the second activation signal 432 at a ninth control terminal 533-1 (e.g. gate terminal). The tenth transistor 534 is configured to receive the first activation signal 431 at a tenth control terminal 534-1 (e.g. gate terminal). The eleventh transistor 535 is configured to receive the first activation signal 431 at a ninth control terminal 535-1 (e.g. gate terminal). The twelfth transistor 536 is configured to receive the second activation signal 432 at a twelfth control terminal 536-1 (e.g. gate terminal).

The input terminals 533-2, 534-2 of the ninth transistor 533 and the tenth transistor 534 are further coupled to the second transistor 416 (e.g. to terminal 416-2 of the second transistor 416) and the sixth transistor 426 (e.g. to terminal 426-2 of the sixth transistor 426). The output terminals 533-3, 534-3 of the ninth transistor 533 and the tenth transistor 534 are further coupled to the fourth transistor 418 (e.g. to terminal 418-2 of the fourth transistor 418) and the eighth transistor 428 (e.g. to terminal 428-2 of the eighth transistor 428).

If the interpolation cell 500 is deactivated (e.g. first activation signal 431 is low, and second activation signal 432 is high), the eleventh transistor 535 and the twelfth transistor 536 are in a conductive state (i.e. on). The ninth transistor 533 and tenth transistor 534 are in a nonconductive state (i.e. off). Accordingly, the thirteenth control terminal 441-1 of the thirteenth transistor 441 is set to the defined potential (e.g. $V_{cc}$) which is supplied to input terminal 535-2 of the eleventh transistor 535. The thirteenth transistor 441 is therefore in a non-conductive state. Accordingly, the fourteenth control terminal 442-1 of the fourteenth transistor 442 is set to the defined potential (e.g. $V_{ss}$) which is supplied to input terminal 536-2 of the twelfth transistor 536. The fourteenth transistor 442 is therefore in a non-conductive state. Since the thirteenth transistor 441 and the fourteenth transistor 442 are in a non-conductive state, the output inverter 440 and, hence, also the interpolation cell 500 present high impedance at its output.

Hence, also the activation circuit 530 may couple the first inverter circuit 410 and the second inverter circuit 420 to the output inverter 440 based on the first activation signal 431 and the second activation signal 432 if the interpolation cell 500 is activated (e.g. first activation signal 431 is high, and second activation signal 432 is low). On the contrary, the activation circuit 530 also allows to decouple the first inverter circuit 410 and the second inverter circuit 420 from the output inverter 440. If the activation circuit 530 is set to an active mode, first signal edges from the first inverter circuit 410 and/or second signal edges from the second inverter circuit 420 may be supplied to the output inverter 440 (depending on the first to fourth selection signals 412, 413, 422, 423). If the activation circuit 430 is set to an inactive mode, no signal edges may be supplied to the output inverter 440.

In some example, one of the interpolation cells 300, 400 or 500 may be used in the apparatus 100 illustrated in FIG. 1, or the DTC 200 illustrated in FIG. 2.

Some examples may relate to a DTC comprising an apparatus for interpolating between a first signal edge and a second signal edge according to one or more aspects of the proposed concept or one or more examples described above, or an interpolation cell according to one or more aspects of the proposed concept or one or more examples described above.

Figure 6:
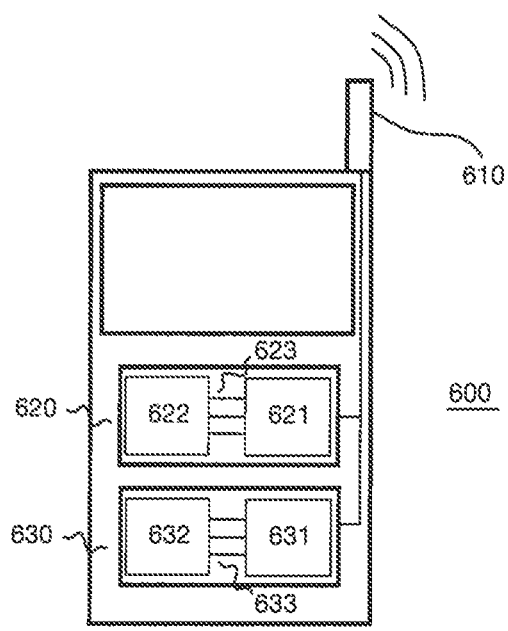
FIG. 6 illustrates an example of a user equipment comprising an apparatus for interpolating between a first signal edge and a second signal edge.

An example of an implementation using a DTC according to one or more aspects of the proposed concept or one or more examples described above is illustrated in FIG. 6. FIG. 6 schematically illustrates an example of a mobile device 600 (e.g. mobile phone, smartphone, tablet-computer, or laptop) comprising a DTC according to an example described herein.

For example, a transmitter 620 may comprise the DTC 621. Further, the transmitter 620 may comprises a management circuit 622. The management circuit 622 may be configured to switch the apparatus for interpolating between a first signal edge and a second signal edge (which is comprises by the DTC 621) to the second mode of operation based on a desired resolution of the interpolation between the first signal edge and the second signal edge. A control path 623 of the transmitter 620 may be configured to supply the control word to the DTC 621. The management circuit 622 may then be further configured to deactivate part of the control path 623 based on a length of the control word.

Further power saving may be achieved by turning off the digital path driving the control bits, since this may, e.g., be a high speed interface.

Further, a receiver 630 may comprise the DTC 631. Further, the receiver 630 may comprises a management circuit 632. The management circuit 632 may be configured to switch the apparatus for interpolating between a first signal edge and a second signal edge (which is comprises by the DTC 631) to the second mode of operation based on a desired resolution of the interpolation between the first signal edge and the second signal edge. A control path 633 of the receiver 630 may be configured to supply the control word to the DTC 631. The management circuit 632 may then be further configured to deactivate part of the control path 633 based on a length of the control word. Further power saving may be achieved by turning off the digital path driving the control bits, since this may, e.g., be a high speed interface.

An antenna element 610 of the mobile device 600 may be coupled to the transmitter 620, or the receiver 630. To this end, mobile device may be provided enabling power modes for more efficient power consumption with regard to a required performance.

In some examples, a turn off and high impedance output mechanism may be implemented in a cell array for reduced physical bits.

In some examples, a driver and MMD output flip-flop size may be controlled according to effective cell array number of bits.

In some examples, the digital path driving the un-used control bits may be turned off.

Figure 7:
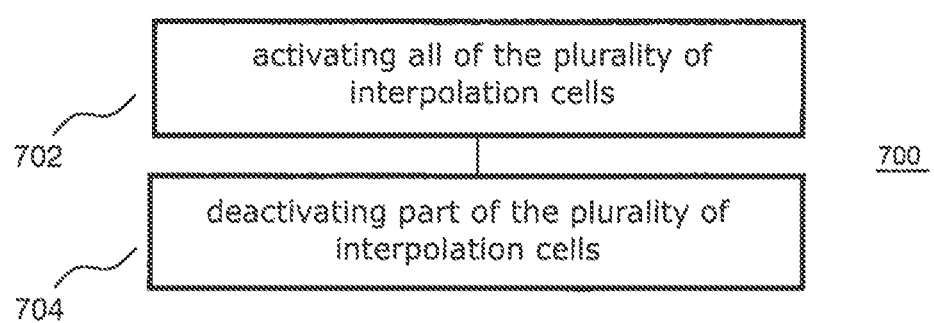
FIG. 7 illustrates a flowchart of an example of a method for controlling an apparatus for interpolating between a first signal edge and a second signal edge.

An example of a method 700 for controlling an apparatus for interpolating between a first signal edge and a second signal edge is illustrated by means of a flowchart in FIG. 7. The apparatus comprises a plurality of interpolation cells, wherein at least one of the plurality of interpolation cells is configured to supply, based on a control word, the first signal edge and/or the second signal edge to the common node. The method 700 comprises activating 702 all of the plurality interpolation cells in a first mode of operation. Further, the method comprises deactivating 704 part of the plurality of interpolation cells in a second mode of operation.

More details and aspects of the method are mentioned in connection with the proposed concept or one or more examples described above (e.g. FIGS. 1-6). The method may comprise one or more additional optional features corresponding to one or more aspects of the proposed concept or one or more examples described above.

The examples as described herein may be summarized as follows:

Example 1 is an apparatus for interpolating between a first signal edge and a second signal edge, comprising: a plurality of interpolation cells coupled to a common node, wherein at least one of the plurality of interpolation cells is configured to supply, based on a control word, the first signal edge and/or the second signal edge to the common node; and a control circuit configured to activate all of the plurality interpolation cells in a first mode of operation, and to deactivate part of the plurality of interpolation cells in a second mode of operation.

In example 2, the apparatus of example 1 further comprises a frequency divider circuit configured to generate a second oscillation signal and a third oscillation signal based on a first oscillation signal, wherein the second oscillation signal is synchronized with a first edge of the first oscillation signal, and wherein the third oscillation signal is synchronized with a second edge of the first oscillation signal; and a sample circuit configured to generate the first signal edge by sampling the second oscillation signal based on the first edge of the first oscillation signal, and to generate the second signal edge by sampling the third oscillation signal based on the second edge of the first oscillation signal.

In example 3, the sample circuit in the apparatus of example 2 comprises a flip-flop circuit.

In example 4, the first signal edge and the second signal edge in the apparatus of example 2 or example 3 are timely separated by one half of an oscillation period of the first oscillation signal.

In example 5, the frequency divider circuit in the apparatus of any of examples 2 to 4 comprises a multi-modulus divider.

In example 6, the control circuit in the apparatus of any of examples 2 to 5 is configured to deactivate the sample circuit in the second mode of operation.

In example 7, the plurality of interpolation cells in the apparatus of any of examples 2 to 6 are grouped in a plurality of interpolation cell rows, wherein the part of the plurality of interpolation cells corresponds to at least one of the plurality of cell rows.

In example 8, the sample circuit in the apparatus of example 7 generates the first signal edge and the second signal edge for one of the plurality of interpolation cell rows, wherein an output node of the sample circuit is coupled to a second output node of a second sample circuit generating the first signal edge and the second signal edge for another one of the plurality of interpolation cell rows.

In example 9, the control circuit in the apparatus of any of the preceding examples is configured to deactivate the part of the plurality of interpolation cells in the second mode of operation based on a desired resolution of the interpolation between the first signal edge and the second signal edge.

In example 10, an output inverter in the apparatus of any of the preceding examples is coupled between the common node and an output node of the apparatus.

In example 11, the output inverter in the apparatus of example 10 is configured to supply an output signal edge to the output node based on the first and/or second signal edges supplied to the common node.

In example 12, one of the plurality of interpolation cells in the apparatus of any of the preceding examples comprises: a first inverter circuit configured to generate inverted first signal edges based on the first signal edge, a first selection signal and a second selection signal; a second inverter circuit configured to generate inverted second signal edges based on the second signal edge, a third selection signal and a fourth selection signal; and an activation circuit coupled to the first inverter circuit and the second inverter circuit and configured to decouple the first inverter circuit and the second inverter circuit from an output inverter of the interpolation cell based on a first activation signal and a second activation signal.

In example 13, the first inverter circuit in the apparatus of example 12 comprises: a first transistor and a second transistor of a first conductivity type which are coupled in series, wherein the first transistor is configured to receive the first signal edge at a first control terminal, and wherein the second transistor is configured to receive the first selection signal at a second control terminal; and a third transistor and a fourth transistor of a different second conductivity type which are coupled in series, wherein the third transistor is configured to receive the first signal edge at a third control terminal, and wherein the fourth transistor is configured to receive the second selection signal at a fourth control terminal.

In example 14, the first selection signal and the second selection signal in the apparatus of example 13 are inverted.

In example 15, the second inverter circuit in the apparatus of example 13 or example 14 comprises: a fifth transistor and a sixth transistor of the first conductivity type which are coupled in series, wherein the fifth transistor is configured to receive the second signal edge at a fifth control terminal, and wherein the sixth transistor is configured to receive the third selection signal at a sixth control terminal; and a seventh transistor and an eighth transistor of the second conductivity type which are coupled in series, wherein the seventh transistor is configured to receive the second signal edge at a seventh control terminal, and wherein the eighth transistor is configured to receive the fourth selection signal at an eighth control terminal.

In example 16, the third selection signal and the fourth selection signal in the apparatus of example 15 are inverted.

In example 17, the activation circuit in the apparatus of example 15 or example 16 comprises: a ninth transistor and a tenth transistor of the first conductivity type which are coupled in series and coupled to the second transistor and the sixth transistor, wherein the ninth transistor is configured to receive the first activation signal at a ninth control terminal, and wherein the tenth transistor is configured to receive the second activation signal at a tenth control terminal; and an eleventh transistor and a twelfth transistor of the second conductivity type which are coupled in series to the ninth transistor and the tenth transistor, and further coupled to the fourth transistor and the eighth transistor, wherein the eleventh transistor is configured to receive the first activation signal at an eleventh control terminal, and wherein the twelfth transistor is configured to receive the second activation signal at a twelfth control terminal.

In example 18, the activation circuit in the apparatus of example 15 or example 16 comprises a ninth transistor of the first conductivity type and a tenth transistor of the second conductivity type which are coupled in parallel, wherein input terminals of the ninth transistor and the tenth transistor are coupled to an eleventh transistor of the first conductivity type, wherein output terminals of the ninth transistor and the tenth transistor are coupled to a twelfth transistor of the second conductivity type, wherein the ninth transistor is configured to receive the second activation signal at a ninth control terminal, wherein the tenth transistor is configured to receive the first activation signal at a tenth control terminal, wherein the input terminals of the ninth transistor and the tenth transistor are further coupled to the second transistor and the sixth transistor, and wherein the output terminals of the ninth transistor and the tenth transistor are further coupled to the fourth transistor and the eighth transistor.

In example 19, the output inverter in the apparatus of any of examples 15 to 18 comprises a thirteenth transistor of the first conductivity type which is coupled in series with a fourteenth transistor of the second conductivity type, wherein a thirteenth control terminal of the thirteenth transistor is coupled the second transistor and the sixth transistor via the activation circuit, and wherein a fourteenth control terminal of the fourteenth transistor is coupled to the fourth transistor and the eighth transistor via the activation circuit.

In example 20, the plurality of interpolation cells in the apparatus of any of the preceding examples are configured to supply either the first signal edge or the second signal edge to the common node, respectively.

Example 21 is an interpolation cell for a digital-to-time converter, wherein the interpolation cell is configured to receive a first signal edge and a second signal edge, the interpolation cell comprising: a first inverter circuit configured to generate inverted first signal edges based on the first signal edge, a first selection signal and a second selection signal; a second inverter circuit configured to generate inverted second signal edges based on the second signal edge, a third selection signal and a fourth selection signal; and an activation circuit coupled to the first inverter circuit and the second inverter circuit and configured to decouple the first inverter circuit and the second inverter circuit from an output inverter of the interpolation cell based on a first activation signal and a second activation signal.

In example 22, the first inverter circuit in the interpolation cell of example 21 comprises: a first transistor and a second transistor of a first conductivity type which are coupled in series, wherein the first transistor is configured to receive the first signal edge at a first control terminal, and wherein the second transistor is configured to receive the first selection signal at a second control terminal; and a third transistor and a fourth transistor of a different second conductivity type which are coupled in series, wherein the third transistor is configured to receive the first signal edge at a third control terminal, and wherein the fourth transistor is configured to receive the second selection signal at a fourth control terminal.

In example 23, the first selection signal and the second selection signal in the interpolation cell of example 22 are inverted.

In example 24, the second inverter circuit in the interpolation cell of example 22 or example 23 comprises: a fifth transistor and a sixth transistor of the first conductivity type which are coupled in series, wherein the fifth transistor is configured to receive the second signal edge at a fifth control terminal, and wherein the sixth transistor is configured to receive the third selection signal at a sixth control terminal; and a seventh transistor and an eighth transistor of the second conductivity type which are coupled in series, wherein the seventh transistor is configured to receive the second signal edge at a seventh control terminal, and wherein the eighth transistor is configured to receive the fourth selection signal at an eighth control terminal.

In example 25, the third selection signal and the fourth selection signal in the interpolation cell of example 24 are inverted.

In example 26, the activation circuit in the interpolation cell of example 24 or example 25 comprises: a ninth transistor and a tenth transistor of the first conductivity type which are coupled in series and coupled to the second transistor and the sixth transistor, wherein the ninth transistor is configured to receive the first activation signal at a ninth control terminal, and wherein the tenth transistor is configured to receive the second activation signal at a tenth control terminal; and an eleventh transistor and a twelfth transistor of the second conductivity type which are coupled in series to the ninth transistor and the tenth transistor, and further coupled to the fourth transistor and the eighth transistor, wherein the eleventh transistor is configured to receive the first activation signal at an eleventh control terminal, and wherein the twelfth transistor is configured to receive the second activation signal at a twelfth control terminal.

In example 27, the activation circuit in the interpolation cell of example 24 or example 25 comprises a ninth transistor of the first conductivity type and a tenth transistor of the second conductivity type which are coupled in parallel, wherein input terminals of the ninth transistor and the tenth transistor are coupled to an eleventh transistor of the first conductivity type, wherein output terminals of the ninth transistor and the tenth transistor are coupled to a twelfth transistor of the second conductivity type, wherein the ninth transistor is configured to receive the second activation signal at a ninth control terminal, wherein the tenth transistor is configured to receive the first activation signal at a tenth control terminal, wherein the input terminals of the ninth transistor and the tenth transistor are further coupled to the second transistor and the sixth transistor, and wherein the output terminals of the ninth transistor and the tenth transistor are further coupled to the fourth transistor and the eighth transistor.

In example 28, the output inverter in the interpolation cell of any of examples 24 to 27 comprises a thirteenth transistor of the first conductivity type which is coupled in series with a fourteenth transistor of the second conductivity type, wherein a thirteenth control terminal of the thirteenth transistor is coupled the second transistor and the sixth transistor via the activation circuit, and wherein a fourteenth control terminal of the fourteenth transistor is coupled to the fourth transistor and the eighth transistor via the activation circuit.

In example 29, the first selection signal, the second selection signal, the third selection signal and the fourth selection signal in the interpolation cell of any of the preceding examples are based on a control word for the digital-to-time converter.

Example 30 is a digital-to-time converter comprising an apparatus for interpolating between a first signal edge and a second signal edge according to any of examples 1 to 20, or an interpolation cell according to any of examples 21 to 29.

Example 31 is a transmitter comprising a digital-to-time converter according to example 30.

In example 32, the transmitter of example 31 further comprises a management circuit configured to switch the apparatus for interpolating between a first signal edge and a second signal edge to the second mode of operation based on a desired resolution of the interpolation between the first signal edge and the second signal edge.

In example 33, the transmitter of example 32 further comprises a control path configured to supply the control word to the digital-to-time converter, wherein the management circuit is further configured to deactivate part of the control path based on a length of the control word.

Example 34 is a receiver comprising a digital-to-time converter according to example 30.

In example 35, the receiver of example 34 further comprises a management circuit configured to switch the apparatus for interpolating between a first signal edge and a second signal edge to the second mode of operation based on a desired resolution of the interpolation between the first signal edge and the second signal edge.

In example 36, the receiver of example 35 further comprises a control path configured to supply the control word to the digital-to-time converter, wherein the management circuit is further configured to deactivate part of the control path based on a length of the control word.

Example 37 is a mobile device comprising a transmitter according to any of examples 31 to 33, or a receiver according to any of examples 34 to 36.

In example 38, the mobile device of example 37 further comprises at least one antenna element coupled to the transmitter, or to the receiver.

Example 39 is a means for interpolating between a first signal edge and a second signal edge, comprising: a plurality of cellular means coupled to a common node, wherein one of the plurality of cellular means is configured to supply, based on a control word, the first signal edge and/or the second signal edge to a common node of the means for interpolating; and a means for activating all of the plurality of cellular means in a first mode of operation, and for deactivating part of the plurality of cellular means in a second mode of operation.

In example 40, the plurality of cellular means in the means of example 39 are grouped in a plurality of rows, and wherein the part of the plurality of cellular means corresponds to at least one of the plurality of rows.

Example 41 is a cellular interpolation means for a digital-to-time converter, wherein the cellular interpolation means is configured to receive a first signal edge and a second signal edge, the cellular interpolation means comprising: a means for generating inverted first signal edges based on the first signal edge, a first selection signal and a second selection signal; a means for generating inverted second signal edges based on the second signal edge, a third selection signal and a fourth selection signal; and a means for decoupling the means for generating inverted first signal edges and/or the means for generating inverted second signal edges from an output inversion means of the cellular interpolation means based on a first activation signal and a second activation signal, wherein the means for coupling is coupled to the means for generating inverted first signal edges and the means for generating inverted second signal edges.

In example 42, the first selection signal, the second selection signal, the third selection signal and the fourth selection signal in the means of example 41 are based on a control word for the digital-to-time converter.

Example 43 is a method for controlling an apparatus for interpolating between a first signal edge and a second signal edge, the apparatus comprising a plurality of interpolation cells, wherein at least one of the plurality of interpolation cells is configured to supply, based on a control word, the first signal edge and/or the second signal edge to the common node, the method comprising: activating all of the plurality interpolation cells in a first mode of operation; and deactivating part of the plurality of interpolation cells in a second mode of operation.

In example 44, the method of example 43 further comprises: generating a second oscillation signal and a third oscillation signal based on a first oscillation signal, wherein the second oscillation signal is synchronized with a first edge of the first oscillation signal, and wherein the third oscillation signal is synchronized with a second edge of the first oscillation signal; generating the first signal edge by sampling the second oscillation signal based on the first edge of the first oscillation signal; and generating the second signal edge by sampling the third oscillation signal based on the second edge of the first oscillation signal.

In example 45, the first signal edge and the second signal edge in the method of example 43 or example 44 are timely separated by one half of an oscillation period of the first oscillation signal.

In example 46, the first signal edge and the second signal edge in the method of example 44 are only generated in the first mode of operation.

In example 47, the plurality of interpolation cells in the method of any of the preceding examples are grouped in a plurality of interpolation cell rows, and wherein the part of the plurality of interpolation cells corresponds to at least one of the plurality of cell rows.

In example 48, deactivating the part of the plurality of interpolation cells in the second mode of operation in the method of any of the preceding examples is based on a desired resolution of the interpolation between the first signal edge and the second signal edge.

In example 49, the method of any of the preceding examples further comprises: supplying an output signal edge to an output node of the apparatus based on the first and/or second signal edges supplied to the common node.

In example 51, the method of any of the preceding examples further comprises: controlling the plurality of interpolation cells to supply either the first signal edge or the second signal edge to the common node, respectively.

Example 51 is a computer readable storage medium having stored thereon a program having a program code for performing the method of any of examples 43 to 50, when the program is executed on a computer or processor.

Example 52 is a computer program having a program code configured to perform the method of any of examples 43 to 50, when the computer program is executed on a computer or processor.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for interpolating between a first signal edge and a second signal edge, comprising:
a plurality of interpolation cells coupled to a common node, wherein at least one of the plurality of interpolation cells is configured to supply, based on a control word, the first signal edge and/or the second signal edge to the common node;
a control circuit configured to activate all of the plurality interpolation cells in a first mode of operation, and to deactivate part of the plurality of interpolation cells in a second mode of operation;
a frequency divider circuit configured to generate a second oscillation signal and a third oscillation signal based on a first oscillation signal, wherein the second oscillation signal is synchronized with a first edge of the first oscillation signal, and wherein the third oscillation signal is synchronized with a second edge of the first oscillation signal; and a sample circuit configured to generate the first signal edge by sampling the second oscillation signal based on the first edge of the first oscillation signal, and to generate the second signal edge by sampling the third oscillation signal based on the second edge of the first oscillation signal.

2. The apparatus of claim 1, wherein the first signal edge and the second signal edge are timely separated by one half of an oscillation period of the first oscillation signal.

3. The apparatus of claim 1, wherein the control circuit is configured to deactivate the sample circuit in the second mode of operation.

4. The apparatus of claim 1, wherein the plurality of interpolation cells are grouped in a plurality of interpolation cell rows, and wherein the part of the plurality of interpolation cells corresponds to at least one of the plurality of cell rows.

5. The apparatus of claim 4, wherein the sample circuit generates the first signal edge and the second signal edge for one of the plurality of interpolation cell rows, wherein an output node of the sample circuit is coupled to a second output node of a second sample circuit generating the first signal edge and the second signal edge for another one of the plurality of interpolation cell rows.

6. The apparatus of claim 1, wherein the control circuit is configured to deactivate the part of the plurality of interpolation cells in the second mode of operation based on a desired resolution of the interpolation between the first signal edge and the second signal edge.

7. The apparatus of claim 1, wherein an output inverter is coupled between the common node and an output node of the apparatus.

8. The apparatus of claim 7, wherein the output inverter is configured to supply an output signal edge to the output node based on the first and/or second signal edges supplied to the common node.

9. The apparatus of claim 1, wherein one of the plurality of interpolation cells comprises:
a first inverter circuit configured to generate inverted first signal edges based on the first signal edge, a first selection signal and a second selection signal;
a second inverter circuit configured to generate inverted second signal edges based on the second signal edge, a third selection signal and a fourth selection signal; and
an activation circuit coupled to the first inverter circuit and the second inverter circuit and configured to decouple the first inverter circuit and the second inverter circuit from an output inverter of the interpolation cell based on a first activation signal and a second activation signal.

10. The apparatus of claim 1, wherein the plurality of interpolation cells are configured to supply either the first signal edge or the second signal edge to the common node, respectively.

11. A digital-to-time converter comprising an apparatus for interpolating between a first signal edge and a second signal edge according to claim 1.

12. An interpolation cell for a digital-to-time converter, wherein the interpolation cell is configured to receive a first signal edge and a second signal edge, the interpolation cell comprising:
a first inverter circuit configured to generate inverted first signal edges based on the first signal edge, a first selection signal and a second selection signal;
a second inverter circuit configured to generate inverted second signal edges based on the second signal edge, a third selection signal and a fourth selection signal; and
an activation circuit coupled to the first inverter circuit and the second inverter circuit and configured to decouple the first inverter circuit and the second inverter circuit from an output inverter of the interpolation cell based on a first activation signal and a second activation signal.

13. The interpolation cell of claim 12, wherein the first inverter circuit comprises:
a first transistor and a second transistor of a first conductivity type which are coupled in series, wherein the first transistor is configured to receive the first signal edge at a first control terminal, and wherein the second transistor is configured to receive the first selection signal at a second control terminal; and
a third transistor and a fourth transistor of a different second conductivity type which are coupled in series, wherein the third transistor is configured to receive the first signal edge at a third control terminal, and wherein the fourth transistor is configured to receive the second selection signal at a fourth control terminal.

14. The interpolation cell of claim 13, wherein the first selection signal and the second selection signal are inverted.

15. The interpolation cell of claim 13, wherein the second inverter circuit comprises:
a fifth transistor and a sixth transistor of the first conductivity type which are coupled in series, wherein the fifth transistor is configured to receive the second signal edge at a fifth control terminal, and wherein the sixth transistor is configured to receive the third selection signal at a sixth control terminal; and
a seventh transistor and an eighth transistor of the second conductivity type which are coupled in series, wherein the seventh transistor is configured to receive the second signal edge at a seventh control terminal, and wherein the eighth transistor is configured to receive the fourth selection signal at an eighth control terminal.

16. The interpolation cell of claim 15, wherein the third selection signal and the fourth selection signal are inverted.

17. The interpolation cell of claim 15, wherein the activation circuit comprises:
a ninth transistor and a tenth transistor of the first conductivity type which are coupled in series and coupled to the second transistor and the sixth transistor, wherein the ninth transistor is configured to receive the first activation signal at a ninth control terminal, and wherein the tenth transistor is configured to receive the second activation signal at a tenth control terminal, and
an eleventh transistor and a twelfth transistor of the second conductivity type which are coupled in series to the ninth transistor and the tenth transistor, and further coupled to the fourth transistor and the eighth transistor, wherein the eleventh transistor is configured to receive the first activation signal at an eleventh control terminal, and wherein the twelfth transistor is configured to receive the second activation signal at a twelfth control terminal.

18. The interpolation cell of claim 15, wherein the activation circuit comprises a ninth transistor of the first conductivity type and a tenth transistor of the second conductivity type which are coupled in parallel, wherein input terminals of the ninth transistor and the tenth transistor are coupled to an eleventh transistor of the first conductivity type, wherein output terminals of the ninth transistor and the tenth transistor are coupled to a twelfth transistor of the second conductivity type, wherein the ninth transistor is configured to receive the second activation signal at a ninth control terminal, wherein the tenth transistor is configured to receive the first activation signal at a tenth control terminal, wherein the input terminals of the ninth transistor and the tenth transistor are further coupled to the second transistor and the sixth transistor, and wherein the output terminals of the ninth transistor and the tenth transistor are further coupled to the fourth transistor and the eighth transistor.

19. The interpolation cell of claim 15, wherein the output inverter comprises a thirteenth transistor of the first conductivity type which is coupled in series with a fourteenth transistor of the second conductivity type, wherein a thirteenth control terminal of the thirteenth transistor is coupled the second transistor and the sixth transistor via the activation circuit, and wherein a fourteenth control terminal of the fourteenth transistor is coupled to the fourth transistor and the eighth transistor via the activation circuit.

20. The interpolation cell of claim 12, wherein the first selection signal, the second selection signal, the third selection signal and the fourth selection signal are based on a control word for the digital-to-time converter.

21. A method for controlling an apparatus for interpolating between a first signal edge and a second signal edge, the apparatus comprising a plurality of interpolation cells, wherein at least one of the plurality of interpolation cells is configured to supply, based on a control word, the first signal edge and/or the second signal edge to the common node, the method comprising:

activating all of the plurality interpolation cells in a first mode of operation; and deactivating part of the plurality of interpolation cells in a second mode of operation generating a second oscillation signal and a third oscillation signal based on a first oscillation signal, wherein the second oscillation signal is synchronized with a first edge of the first oscillation signal, and wherein the third oscillation signal is synchronized with a second edge of the first oscillation signal;

generating the first signal edge by sampling the second oscillation signal based on the first edge of the first oscillation signal; and generating the second signal edge by sampling the third oscillation signal based on the second edge of the first oscillation signal.

22. The method of claim 21, wherein the first signal edge and the second signal edge are only generated in the first mode of operation.

23. The method of claim 21, wherein deactivating the part of the plurality of interpolation cells in the second mode of operation is based on a desired resolution of the interpolation between the first signal edge and the second signal edge.

* * * * *